United States Patent
Song et al.

(10) Patent No.: US 12,407,312 B2
(45) Date of Patent: Sep. 2, 2025

(54) SAMPLE-AND-HOLD AMPLIFIER

(71) Applicant: Silergy Semiconductor Technology (Hangzhou) LTD, Zhejiang (CN)

(72) Inventors: Lin Song, Hangzhou (CN); Guangyang Qu, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 255 days.

(21) Appl. No.: 18/080,027

(22) Filed: Dec. 13, 2022

(65) Prior Publication Data

US 2023/0208372 A1 Jun. 29, 2023

(30) Foreign Application Priority Data

Dec. 23, 2021 (CN) .......................... 202111608815.4

(51) Int. Cl.
*H03F 1/02* (2006.01)
*H03F 3/45* (2006.01)

(52) U.S. Cl.
CPC ..... *H03F 3/45753* (2013.01); *H03F 3/45273* (2013.01); *H03F 3/45645* (2013.01); *H03F 3/45475* (2013.01)

(58) Field of Classification Search
CPC ............ H03F 3/45753; H03F 3/45273; H03F 3/45645; H03F 2203/45514; H03F 2203/45526; H03F 2203/45534; H03F 2203/45724; H03F 2203/45726; H03F 3/45183; H03F 3/45475; H03F 1/02; H03F 1/303; H03M 1/1245

USPC .................................................. 330/252–261
See application file for complete search history.

(56) References Cited

U.S. PATENT DOCUMENTS

| | | | | |
|---|---|---|---|---|
| 4,439,693 A | * | 3/1984 | Lucas | G11C 27/026 327/100 |
| 5,721,563 A | * | 2/1998 | Memida | G11C 27/026 345/98 |
| 7,414,464 B2 | * | 8/2008 | Lin | H03F 3/45977 330/9 |
| 8,558,852 B2 | * | 10/2013 | Maki | G09G 3/3688 345/98 |
| 8,710,819 B2 | | 4/2014 | Chen | |
| 8,917,528 B2 | | 12/2014 | Xu | |
| 9,018,855 B2 | | 4/2015 | Chen | |
| 9,054,546 B2 | | 6/2015 | Zhao | |
| 9,054,592 B2 | | 6/2015 | Yao et al. | |
| 9,331,588 B2 | | 5/2016 | Chen | |
| 9,762,128 B2 | | 9/2017 | Zhang et al. | |
| 2008/0157874 A1 | | 7/2008 | Lin | |
| 2017/0077802 A1 | | 3/2017 | Wei et al. | |
| 2021/0242784 A1 | | 8/2021 | Yang et al. | |

* cited by examiner

*Primary Examiner* — Khanh V Nguyen

(57) ABSTRACT

A sample-and-hold amplifier can include: an operational amplifier; a sampling capacitor having a first terminal coupled to an inverting input terminal of the operational amplifier, and a second terminal coupled to a reference ground; and a switching circuit configured to switch feedback paths of the sample-and-hold amplifier in a first stage and a second stage, such that an offset voltage of the operational amplifier is at least partially eliminated.

14 Claims, 3 Drawing Sheets

SAMPLE-AND-HOLD AMPLIFIER

RELATED APPLICATIONS

This application claims the benefit of Chinese Patent Application No. 202111608815.4, filed on Dec. 23, 2021, which is incorporated herein by reference in its entirety.

FIELD OF THE INVENTION

The present invention generally relates to the field of electronic circuits, and more particularly, to sample-and-hold amplifiers.

BACKGROUND

In general, the offset voltage and low-frequency noise of a sample-and-hold amplifier are key factors that affect the accuracy of the sample-and-hold amplifier. In some approaches, the methods for eliminating offset voltage mainly include an auto-zero method and a chopping method.

DETAILED DESCRIPTION

Figure 1:
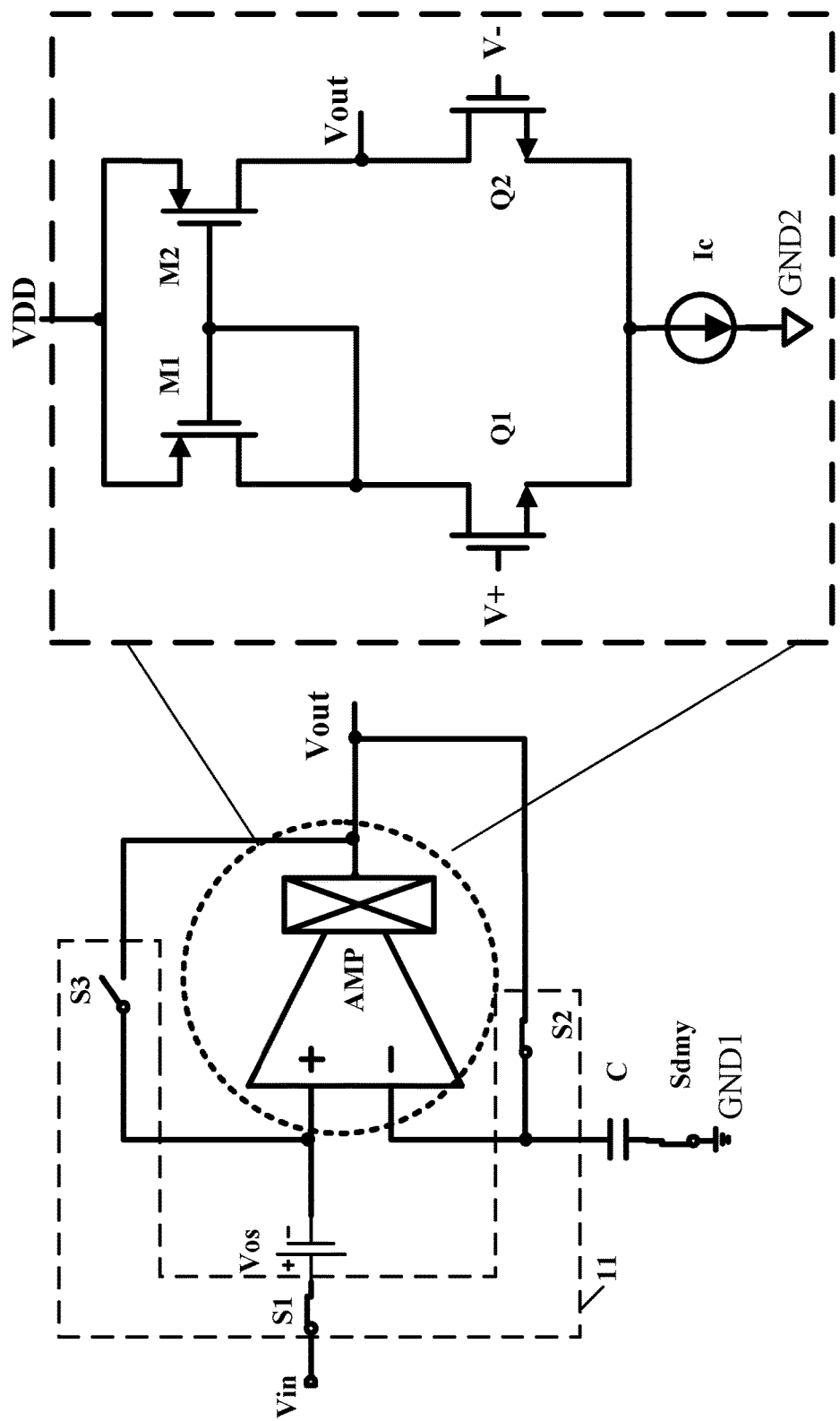
FIG. 1 is a schematic circuit diagram of an example sample-and-hold amplifier in the first stage, in accordance with embodiments of the preset invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In the auto-zero method, the input terminal of the sample-and-hold amplifier can connect with a sampling capacitor, and a switch can connect between the input terminal and the output terminal of the sample-and-hold amplifier. Under the control of the clock signals (e.g., two-phase non-overlapping clock), the sample-and-hold amplifier may operate alternately in the sampling phase and the holding phase. In the sampling phase, the switch can be turned on, the input terminal and output terminal of the sample-and-hold amplifier can be connected, and the DC offset voltage and low-frequency noise of the sample-and-hold amplifier may be stored on the sampling capacitor. In the holding phase, the switch is turned off, and the sample-and-hold amplifier can be in a normal open-loop operating mode, such that the DC offset voltage and low-frequency noise of the sample-and-hold amplifier and the voltage stored on the sampling capacitor can be cancelled out at the input terminal, thus dynamically eliminating the DC offset voltage and low-frequency noise. However, this type of auto-zero sample-and-hold amplifier has the following disadvantages: the input current is relatively large because the sampling capacitor needs to be directly driven by the input terminal of sample-and-hold amplifier; and the noise is relatively high because the sampling capacitor may not be too large due to limitations of the input current.

In the chopping method, the input terminal and output terminal of the sample-and-hold amplifier can be connected with first and second switches, respectively. The control signals of the first and second switches may have the same phase and frequency, thereby performing differential signal cross-inversion on the input voltage signal and the output voltage signal, respectively. The input voltage signal can be chopped twice to generate a DC signal, and the DC offset voltage of the sample-and-hold amplifier may be chopped once to generate high-frequency square wave signal, such the low-pass filter (LPF) can be used to filter out the DC offset voltage. An additional low-pass filter may be connected to the output terminal of the sample-and-hold amplifier in the chopping method, thus limiting the bandwidth of the sample-and-hold amplifier.

Figure 2:
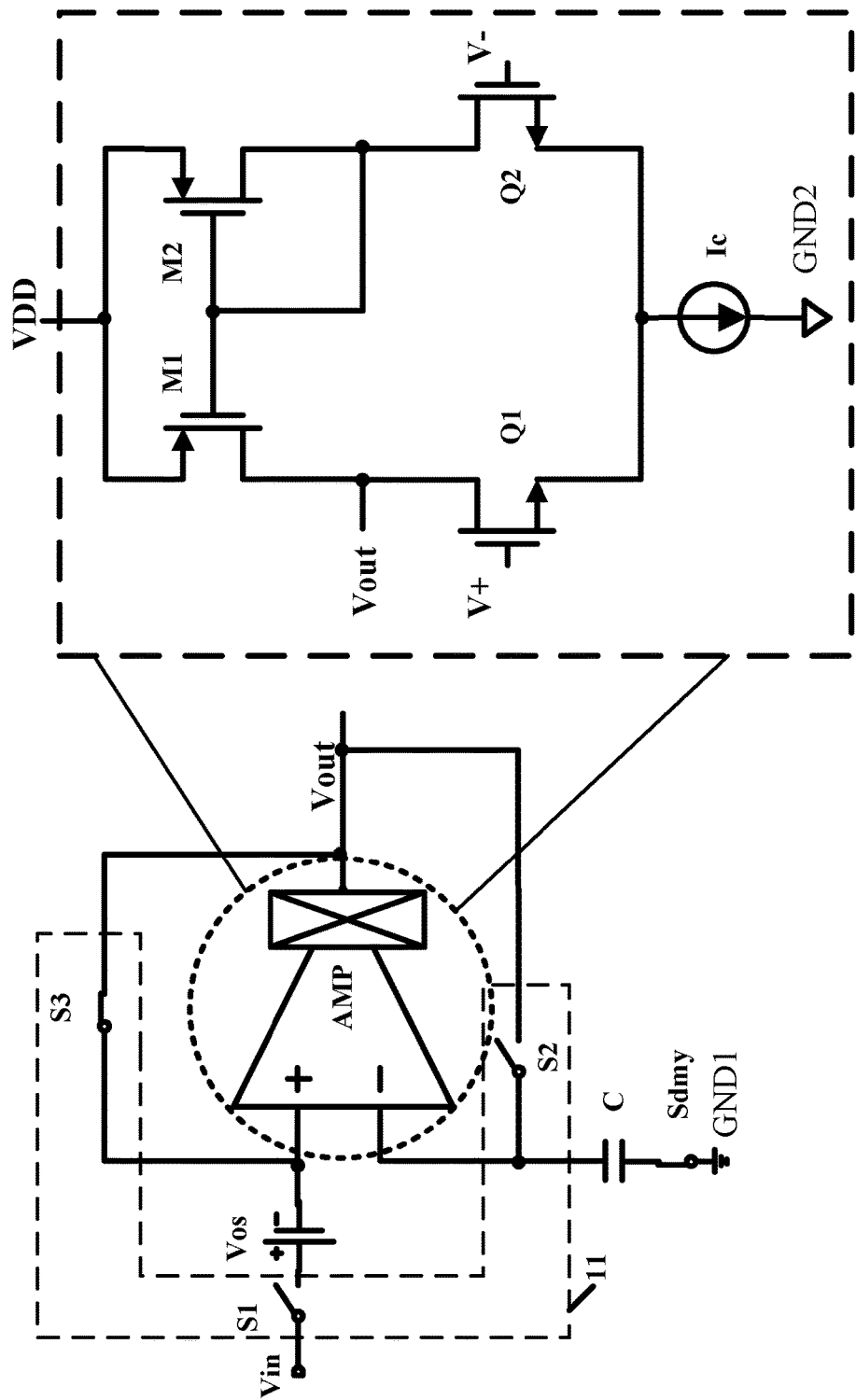
FIG. 2 is a schematic circuit diagram of an example sample-and-hold amplifier in the second stage, in accordance with embodiments of the preset invention.

Referring now to FIG. 1, shown is a schematic circuit diagram of an example sample-and-hold amplifier in the first stage, in accordance with embodiments of the preset invention. Referring also to FIG. 2, shown is a schematic circuit diagram of an example sample-and-hold amplifier in the second stage, in accordance with embodiments of the preset invention. In this particular example, the sample-and-hold amplifier can include operational amplifier AMP, sampling capacitor C, and switching circuit 11. For example, the first terminal of sampling capacitor C can connect to the inverting input terminal of operational amplifier AMP, and the second terminal of sampling capacitor C can connect to reference ground GND1. Sampling capacitor C can store offset voltage Vos of the sample-and-hold amplifier. Switching circuit 11 can be used for switching the feedback path of the sample-and-hold amplifier in the first and second stages, such that offset voltage Vos of operational amplifier AMP is offset.

It should be noted that sampling capacitor C may be an independent capacitor device, or an equivalent capacitor composed of a plurality of capacitor devices connected in series or/and parallel. The DC offset voltage can be stored on the sampling capacitor in the first phase, and the DC offset voltage may be eliminated by using a sampling voltage stored on the sampling capacitor in the second phase.

For example, in the first stage, switching circuit 11 can select the first path as the feedback path of the sample-and-hold amplifier, and input voltage Vin can be allowed to be connected to one of input terminals of operational amplifier AMP, such that operational amplifier AMP operates in a unity gain mode. In the unity gain mode, input voltage Vin and offset voltage Vos of the sample-and-hold amplifier can be sampled on sampling capacitor C. That is, the sampling voltage on sampling capacitor C is the sum of input voltage Vin and offset voltage Vos. In the second stage, switching circuit 11 can select the second path as the feedback path of the sample-and-hold amplifier, and input voltage Vin may not be allowed to be connected to one of input terminals of operational amplifier AMP. The output signal of operational amplifier AMP can be chopped, such that operational amplifier AMP operates in an inverted holding mode, thereby transferring the sampling voltage on sampling capacitor C to the output terminal of operational amplifier AMP. Also, the output voltage of the operational amplifier can be a difference between the sampling voltage on the sampling capacitor sampled in the first stage and the offset voltage, thereby eliminating the offset voltage.

For example, switching circuit 11 can include switches S1, S2, and S3. For example, the first terminal of switch S1 may receive input voltage Vin of the sample-and-hold amplifier, and the second terminal of switch S1 can connect to the non-inverting input terminal of operational amplifier AMP. Switch S2 can connect between the inverting input terminal and the output terminal of the operational amplifier AMP. Switch S3 can connect between the non-inverting input terminal and the output terminal of the operational amplifier AMP. In the first stage, switches S1 and S2 may be turned on, and switch S3 turned off, such that operational amplifier AMP operates in the unity gain mode, and input voltage Vin and offset voltage Vos of the sample-and-hold amplifier are sampled on sampling capacitor C. In the second stage, switches S1 and S2 can be turned off, switch S3 turned on, and the output signal of operational amplifier AMP can be chopped, such that operational amplifier AMP operates in the inverted holding mode, thereby transferring the sampling voltage on sampling capacitor C to the output terminal of operational amplifier AMP. Switching circuit 11 can be any suitable path selection circuit in certain embodiments.

It should be noted that since the feedback paths of the sample-and-hold amplifier are different paths in the first and second stages, in order to realize the negative feedback of the closed loop, the output terminal of operational amplifier AMP may be located at different circuit nodes in the internal structure of operational amplifier AMP in the first and second stages. That is, the output terminal of operational amplifier AMP can be switched in the first and second stages, such that chopping can be performed at the output terminal of operational amplifier AMP. Therefore, the circuit structure diagram of a specific operational amplifier is taken as an example, in order to explain the difference of the operating modes of the sample-and-hold amplifier when the above-mentioned different circuit nodes are selected as the output terminal of operational amplifier AMP.

Figure 3:
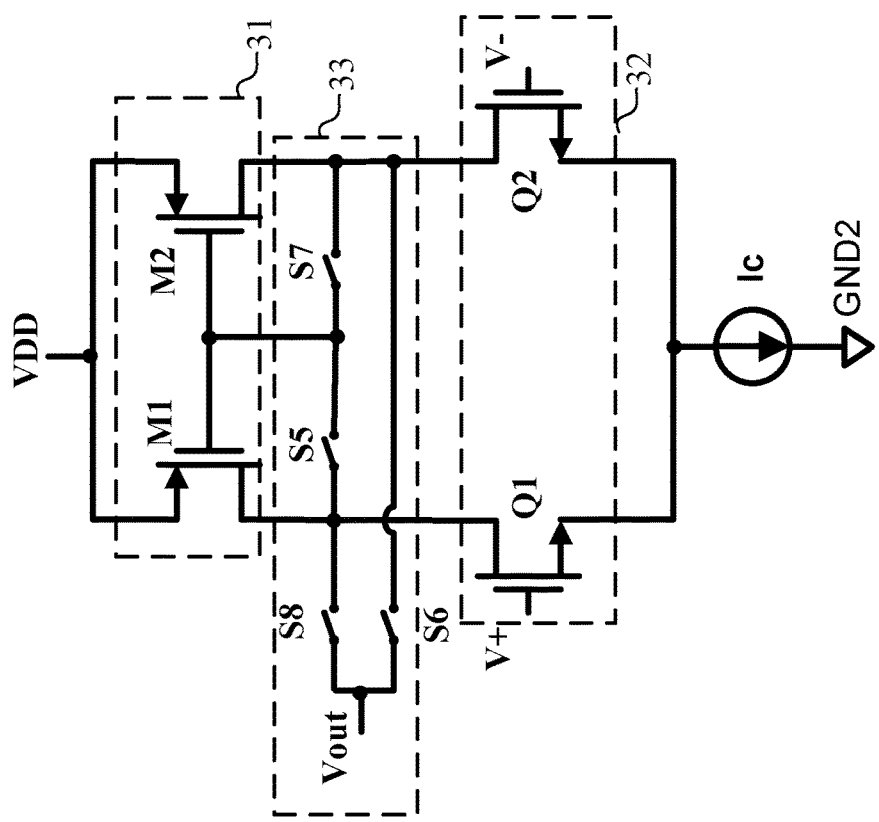
FIG. 3 is a schematic circuit diagram of an example operational amplifier, in accordance with embodiments of the preset invention.

Referring now to FIG. 3, shown is a schematic circuit diagram of an example operational amplifier, in accordance with embodiments of the preset invention. In this particular example, operational amplifier AMP can include current mirror circuit 31, signal input circuit 32, and current source Ic. Current mirror circuit 31 can include transistors M1 and M2. For example, the control terminals of transistors M1 and M2 can connect, and the first power terminals of transistors M1 and M2 can connect to supply voltage VDD.

Signal input circuit 32 can include transistors Q1 and Q2. For example, the control terminal of transistor Q1 can be the non-inverting input terminal of operational amplifier AMP, and the first power terminal of transistor Q1 can connect to the second power terminal of transistor M1. The control terminal of transistor Q2 can be the inverting input terminal of operational amplifier AMP, and the first power terminal of transistor Q2 can connect to the second power terminal of transistor M2. The second power terminal of transistor Q1 can connect to the second power terminal of transistor Q2. Current source Ic can connect between the common node of transistors Q1 and Q2 and ground terminal GND2.

In the first stage shown in FIG. 1, the control terminals of transistors M1 and M2 can connect to the common node of transistors Q1 and M1, and the output terminal of operational amplifier AMP can be configured as the first power terminal of transistor Q2. In the second stage shown in FIG. 2, the control terminals of transistors M1 and M2 can connect to the common node of transistors Q2 and M2, and the output terminal of operational amplifier AMP can be configured as the first power terminal of transistor Q1. It should be noted that the structure of operational amplifier AMP is not limited to this, and it can be other suitable circuitry that realizes the same function.

In particular embodiments, transistors M1 and M2 can be P-type field effect transistors, and transistors Q1 and Q2 can be N-type field-effect transistors. In another example, transistors M1 M2, Q1, and Q2 may be one of P-type field effect transistors or N-type field effect transistors, respectively. In another example, transistors M1, M2, Q1, and Q2 can be junction field-effect transistors (JFET). In other examples, transistors M1, M2, Q1, and Q2 can be other types of field-effect transistors. Furthermore, operational amplifier AMP can also include switch module 33. By controlling the switching state of each switch in switch module 33, the output terminal of operational amplifier AMP can be configured as the first power terminal of transistor Q2 in the first stage. The output terminal of operational amplifier AMP can be configured as the first power terminal of transistor Q1 in the second stage.

In particular embodiments, switch module 33 can include switches S5 to S8. For example, the first terminal of switch S5 can connect to the common node of transistors Q1 and M1, and the second terminal of switch S5 can connect to the common node of the control terminals of transistors M1 and M2. The first terminal of switch S6 can be configured as the output terminal of operational amplifier AMP, and the second terminal of switch S6 can connect to the common node of transistors Q2 and M2. The first terminal of switch S7 can connect to the second terminal of switch S5, and the second terminal of switch S7 can connect to the second terminal of switch S6. The first terminal of switch S8 can connect to the first terminal of switch S6, and the second terminal of switch S8, can connect to the first terminal of switch S5.

In the first stage, switches S5 and S6 can be turned on, and switches S7 and S8 turned off. Thus, the control terminal and the second power terminal of transistor M1 can be connected, and the output terminal of operational amplifier AMP may be configured as the first power terminal of transistor Q2. In the second stage, switches S5 and S6 can be turned off, and switches S7 and S8 turned on. Thus, the control terminal and the second power terminal of transistor M2 can be connected, and the output terminal of operational amplifier AMP may be configured as the first power terminal of transistor Q1. The equivalent circuits of operational amplifier AMP in the first and second stages correspond to the structures in the rectangular dotted boxes shown in FIG. 1 and FIG. 2, respectively.

In the sampling stage shown in FIG. 1, switches S1 and S2 of the sample-and-hold amplifier can be turned on, switch S3 may be turned off, and operational amplifier AMP can operate in the unity gain mode. At this time, input voltage Vin and offset voltage Vos can be sampled on sampling capacitor C, so sampling voltage V on sampling capacitor C can be equal to the sum of input voltage Vin and offset voltage Vos (e.g., V=Vin+Vos).

In the holding stage shown in FIG. 2, switch S3 can be turned on, switches S1 and S2 may be turned off, and the output voltage of operational amplifier AMP can be chopped. Then, sampling voltage V on sampling capacitor C can be transferred to the output terminal of operational amplifier AMP. At this time, the output voltage Vout of operational amplifier AMP can be equal to the difference between sampling voltage V on sampling capacitor C and offset voltage Vos (e.g., Vout=V−Vos=Vin+Vos−Vos=Vin). It can be seen that by switching the feedback path of the sample-and-hold amplifier, offset voltage Vos of operational amplifier AMP can be offset in output voltage Vout of operational amplifier AMP.

In particular embodiments, by adjusting the feedback path in two operating stages, the sample-and-hold amplifier has the intrinsic ability to eliminate the offset voltage. In addition, the additional noise generated by the sampling capacitor can be reduced by maximizing the sampling capacitor.

In particular embodiments, in order to minimize the charge injection amount of sampling capacitor C during the switching process of switch S2, switch S2 can be a switch with the smallest size, and a dummy component can be added at sampling capacitor C. In this example, the dummy component can be configured as switch Sdmy. Therefore, the sample-and-hold amplifier can also include switch Sdmy connected in series with sampling capacitor C. A zero point may be formed according to switch Sdmy and sampling capacitor C to compensate the pole formed according to switch S2 and sampling capacitor C, thus improving the stability of the system. For example, switch Sdmy can be always on, and the size of switch Sdmy is similar to or consistent with (e.g., the same as) that of switch S2, such that their on-resistance is the same.

In order to minimize the extra noise of sampling in sampling capacitor C, the capacitance value of sampling capacitor C may generally be as large as possible, which can reduce the frequency of the non-dominant pole (e.g., formed according to the on-resistance of switch S2 and sampling capacitor C). If the frequency of the pole is too low, the stability of the system can deteriorate, thus leaving less phase margin. Therefore, switch Sdmy may be connected in series with sampling capacitor C to generate the zero point, in order to compensate the non-dominant pole. The zero point formed according to the on-resistance of switch Sdmy and sampling capacitor C can track the pole formed according to switch S2 and sampling capacitor C, and the zero point and the pole can cancel each other out, thus ensuring that the system loop still has good stability even when the capacitance value of sampling capacitor C is large. In other examples, the dummy component (e.g., switch Sdmy) can be replaced by a resistor, and the resistor can generate a zero point with sampling capacitor C, in order to compensate the pole generated by switch S2 and sampling capacitor C, thereby improving the stability of the system. The resistance of the resistor can be the same as the on-resistance of switch S2.

In particular embodiments, the sample-and-hold amplifier has the ability to eliminate the intrinsic offset voltage and low-frequency noise by adjusting the feedback path in two operating stages. In addition, the input current of the sample-and-hold amplifier of the present invention can be greatly reduced because the sampling capacitor is directly driven by the operational amplifier instead of the input terminal of operational amplifier. The extra sampling noise caused by the sampling capacitor can be reduced by maximizing the capacitance value the sampling capacitor. Also, a dummy component can be added at the sampling capacitor to ensure that the system loop still has good stability when the capacitance value of the sampling capacitor is large.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A sample-and-hold amplifier, comprising:
   a) an operational amplifier comprising a switch module;
   b) a sampling capacitor having a first terminal coupled to an inverting input terminal of the operational amplifier, and a second terminal coupled to a reference ground;
   c) a switching circuit configured to switch feedback paths of the sample-and-hold amplifier in a first stage and a second stage, such that an offset voltage of the operational amplifier is at least partially eliminated; and
   d) wherein an output terminal of the operational amplifier is respectively coupled via the switch module to different circuit nodes therein in the first stage and the second stage.

2. The sample-and-hold amplifier of claim 1, wherein:
   a) in the first stage, the operational amplifier operates in a unity gain mode, and an input voltage of the sample-and-hold amplifier and the offset voltage are sampled on the sampling capacitor; and
   b) in the second stage, the operational amplifier operates in an inverted holding mode, and a sampling voltage on the sampling capacitor is transferred to the output terminal of the operational amplifier.

3. The sample-and-hold amplifier of claim 1, wherein a DC offset voltage of the operational amplifier is stored on the sampling capacitor in the first stage, and the DC offset voltage is eliminated by using a sampling voltage stored on the sampling capacitor in the second stage.

4. The sample-and-hold amplifier of claim 1, wherein:
   a) in the first stage, a sampling voltage on the sampling capacitor is a sum of an input voltage of the sample-and-hold amplifier and the offset voltage; and
   b) in the second stage, an output voltage of the operational amplifier is a difference between the sampling voltage on the sampling capacitor sampled in the first stage and the offset voltage, thereby eliminating the offset voltage.

5. The sample-and-hold amplifier of claim 1, wherein the switching circuit comprises:
   a) a first switch having a first terminal for receiving an input voltage of the sample-and-hold amplifier, and a second terminal coupled to a non-inverting input terminal of the operational amplifier;
   b) a second switch coupled between the inverting input terminal and the output terminal of the operational amplifier;
   c) a third switch coupled between the non-inverting input terminal and the output terminal of the operational amplifier;
   d) wherein in the first stage, the first switch and the second switch are turned on, and the third switch is turned off; and
   e) wherein in the second stage, the first switch and the second switch are turned off, and the third switch is turned on.

6. The sample-and-hold amplifier of claim 1, wherein the switch module comprises a plurality of switches that are controlled in complementary fashion in the first stage and the second stage.

7. The sample-and-hold amplifier of claim 1, wherein the operational amplifier comprises:
   a) a current mirror circuit having a first transistor and a second transistor, wherein control terminals of the first transistor and the second transistor are coupled, and first power terminals of the first transistor and the second transistor are coupled;
- b) a signal input circuit having a third transistor and a fourth transistor, wherein a control terminal of the third transistor is configured as a non-inverting input terminal of the operational amplifier, a first power terminal of the third transistor is coupled to a second power terminal of the first transistor, a control terminal of the fourth transistor is configured as the inverting input terminal of the operational amplifier, a first power terminal of the fourth transistor is coupled to a second power terminal of the second transistor, and second power terminals of the third transistor and the fourth transistor are coupled; and
- c) a current source coupled between a common node of the third transistor and the fourth transistor and a ground terminal.

8. The sample-and-hold amplifier of claim 7, wherein by controlling switching states of each switch in the switch module, the output terminal of the operational amplifier is coupled to the first power terminal of the fourth transistor in the first stage, and the output terminal of the operational amplifier is coupled to the first power terminal of the third transistor in the second stage.

9. The sample-and-hold amplifier of claim 8, wherein the switch module comprises:
- a) a fifth switch having a first terminal coupled to a common node of the third transistor and the first transistor, and a second terminal coupled to a common node of the control terminals of the first transistor and the second transistor;
- b) a sixth switch having a first terminal configured as the output terminal of the operational amplifier, and a second terminal coupled to a common node of the fourth transistor and the second transistor;
- c) a seventh switch having a first terminal coupled to the second terminal of the fifth switch, and a second terminal coupled to the second terminal of the sixth switch;
- d) an eighth switch having a first terminal configured as the output terminal of the operational amplifier, and a second terminal coupled to the first terminal of the fifth switch; and
- e) wherein the fifth switch and the sixth switch are only turned on in the first stage, and the seventh switch and the eighth switch are only turned on in the second stage.

10. The sample-and-hold amplifier of claim 5, further comprising a ninth switch coupled in series with the sampling capacitor, wherein a zero point is formed according to the ninth switch and the sampling capacitor to compensate a pole point formed according to the second switch and the sampling capacitor, in order to increase system stability.

11. The sample-and-hold amplifier of claim 5, further comprising a first resistor coupled in series with the sampling capacitor, wherein a zero point is formed according to the first resistor and the sampling capacitor to compensate a pole point formed according to the second switch and the sampling capacitor, in order to increase system stability.

12. The sample-and-hold amplifier of claim 10, wherein the ninth switch is configured to be always on.

13. The sample-and-hold amplifier of claim 10, wherein a size of the ninth switch is similar to or consistent with a size of the second switch, such that an on-resistance of the ninth switch is the same as an on-resistance of the second switch.

14. The sample-and-hold amplifier of claim 11, wherein a resistance of the first resistor is the same as an on-resistance of the second switch.

* * * * *